(12) United States Patent
Kinoshita

(10) Patent No.: US 6,211,029 B1
(45) Date of Patent: Apr. 3, 2001

(54) PROCESS OF FABRICATING A BIPOLAR TRANSISTOR HAVING LIGHTLY DOPED EPITAXIAL COLLECTOR REGION CONSTANT IN DOPANT IMPURITY

(75) Inventor: Yasushi Kinoshita, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/580,855

(22) Filed: May 30, 2000

Related U.S. Application Data

(60) Division of application No. 08/807,326, filed on Feb. 27, 1997, which is a continuation-in-part of application No. 08/802,313, filed on Feb. 18, 1997, now abandoned.

(51) Int. Cl.[7] .................................................. H01L 21/331
(52) U.S. Cl. ............................ 438/357; 438/341; 438/309
(58) Field of Search ..................................... 438/309, 364, 438/365, 481, 341, 429, 357, 363

(56) References Cited

U.S. PATENT DOCUMENTS 5,422,299 * 6/1995 Neudeck et al. .
5,504,018 * 4/1996 Sato .
6,140,196 * 10/2000 Tung ..................................... 438/341

* cited by examiner

*Primary Examiner*—Tuan H. Nguyen
(74) *Attorney, Agent, or Firm*—Hayes, Soloway, Hennessey, Grossman & Hage, PC

(57) ABSTRACT

A bipolar transistor has a lightly doped n-type single crystal silicon layer epitaxially grown in a recess formed in a heavily doped n-type impurity region after a selective growth of a thick field oxide layer, a base region, an emitter region and a collector contact region are formed in surface portions of the lightly doped n-type single crystal silicon layer, and the single crystal silicon layer is not affected by the heat during the growth of the thick field oxide layer, and has a flat zone constant in dopant concentration regardless of the thickness thereof.

4 Claims, 13 Drawing Sheets

PROCESS OF FABRICATING A BIPOLAR TRANSISTOR HAVING LIGHTLY DOPED EPITAXIAL COLLECTOR REGION CONSTANT IN DOPANT IMPURITY

This Application is a Divisional of Ser. No. 08/807,326 filed Feb. 27, 1997 which is a Continuation-in-Part of Ser. No. 08/802,313 filed Feb. 28, 1997 now ABN.

FIELD OF THE INVENTION

This invention relates to a semiconductor device and, more particularly, to a structure of a bipolar transistor and a process of fabrication thereof.

DESCRIPTION OF THE RELATED ART

A bipolar transistor is an important circuit component of a semiconductor integrated circuit device used for a communication network in the giga-helz band. The switching speed of the bipolar transistor is mainly dominated by the thickness of the base region where the carrier passes through. The thinner the base region is, the faster the switching action is. The resistance of the emitter, base and collector regions and the parasitic capacitances coupled to the emitter/base and collector regions affect the switching speed of the bipolar transistor. These factors strongly relate to the miniaturization and the accuracy of patterning technologies used in the fabrication process of the bipolar transistor. However, a self-aligning technology between the emitter region and the base contact region makes the improvement in switching speed free from the accuracy of patterning technologies. The self-aligning technology is disclosed by Tak H. Ning et al. in "Self-Aligned Bipolar Transistors for High-Performance and Low-Power Delay VLSI", IEEE Transactions on Electron Devices", vol. ED-28, No. 9, September 1981, pages 1010 to 1013.

FIGS. 1A to 1G illustrate a typical example of the process of fabricating the self-aligned bipolar transistor of the n-p-n type. The prior art process starts with preparation of a p-type silicon substrate 1. A photo-resist ion-implantation mask (not shown) is prepared on the major surface of the p-type silicon substrate 1 by using lithographic techniques, and an area is uncovered with the photo-resist ion-implantation mask. Arsenic is ion implanted into the area, and the photo-resist ion-implantation mask is stripped off. The ion-implanted arsenic is activated in nitrogen ambience at 1000 degrees to 1200 degrees in centigrade for 2 to 4 hours, and forms a heavily doped n-type buried layer 1b.

A photo-resist ion-implantation mask (not shown) is patterned on the major surface of the p-type silicon layer 1a by using the lithographic techniques, and another area around the heavily doped n-type buried region 1b is uncovered with the photo-resist ion-implantation mask. Boron is ion implanted into the exposed area, and the photo-resist ion-implantation mask is stripped off. The ion-implanted boron is activated in the nitrogen ambience at 900 degrees to 1100 degrees in centigrade for 30 minutes to an hour, and forms a heavily doped p-type buried region 1c as shown in FIG. 1A. The heavily doped p-type buried region 1c electrically isolates the self-aligned bipolar transistor from another circuit component.

N-type silicon is epitaxially grown to 2 microns thick on the major surface of the p-type silicon substrate 1a, and the p-type silicon substrate 1a is overlain by an n-type epitaxial silicon layer 2a. A p-type channel stopper region 2b is formed in the n-type epitaxial silicon layer 2a, and is merged with the heavily doped p-type buried layer 1c as shown in FIG. 1B.

A thick field oxide layer 3 is selectively grown to 600 nanometers thick by using the LOCOS (local oxidation of silicon) technology. The growth of the thick filed oxide layer 3 is carried out at 1000 degrees in centigrade, and consumes long time. While the heat is growing the thick field oxide layer 3, the boron and the arsenic are diffused from the heavily-doped p-type buried layer/p-type channel stopper region 1c/2b and the heavily doped n-type buried layer 1b, respectively, and the n-type buried layer 1b expands as shown in FIG. 1C. As a result, the expansion of the n-type buried layer 1b decreases the thickness of the n-type epitaxial layer 2a inside of the thick field oxide layer 3.

Subsequently, phosphorous is thermally diffused into a narrow area of the n-type epitaxial layer 2a, and reaches the heavily doped n-type buried layer 1b. The phosphorous forms an n-type collector contact region 4a merged into the heavily doped n-type buried layer 1b.

Silicon oxide is deposited over the entire surface of the resultant semiconductor structure by using a chemical vapor deposition, and forms a silicon oxide layer. A photo-resist etching mask is patterned on the silicon oxide layer through the lithography, and the silicon oxide layer is selectively etched away. The silicon oxide layer is patterned into a silicon oxide mask 5a. The n-type collector contact region 4a is covered with the silicon oxide mask 5a; however, the n-type epitaxial silicon layer 2a is exposed to an opening of the silicon oxide mask 5a as shown in FIG. 1D.

Subsequently, polysilicon is deposited over the entire surface of the resultant semiconductor structure by using a chemical vapor deposition, and p-type dopant impurity is introduced into the polysilicon layer. In this instance, boron is introduced into the polysilicon through an in-situ doping technique, or boron is ion implanted into the amorphous silicon layer. The boron-doped polysilicon layer is used for a base electrode as described hereinlater.

In order to isolate the base electrode from an emitter electrode, silicon nitride is deposited over the boron-doped polysilicon layer, and the boron-doped polysilicon layer is overlain by a silicon nitride layer. A photo-resist etching mask (not shown) is patterned on the silicon nitride layer, and the silicon nitride layer and the boron-doped polysilicon layer are selectively etched away so as to form a base electrode 4b covered with an inter-level insulating layer 5b as shown in FIG. 1E.

A photo-resist etching mask (not shown) is patterned on the inter-level insulating layer 5b, and has an opening over a central area of the n-type epitaxial silicon layer 2a. Using the photo-resist etching mask, the inter-level insulating layer 5b and the base electrode 4b are selectively etched away so as to form an opening 5c over the central area of the n-type epitaxial layer 2a.

The resultant semiconductor structure is treated with heat, and the boron is diffused from the base electrode 4b into the central area of the n-type epitaxial layer 2a. The boron forms a graft base region 4c beneath the base electrode 4b. Boron or boron difluoride ($BF_2$) is ion implanted into the central area of the n-type epitaxial silicon layer 2a, and forms an intrinsic base region 4d as shown in FIG. 1F.

Silicon oxide is deposited over the entire surface of the resultant semiconductor structure, and forms a silicon oxide layer topographically extending over the resultant semiconductor structure. The silicon oxide layer is anisotropically etched away without a photo-resist etching mask, and side wall spacers 5d/5e are left on the inner and outer side surfaces of the base electrode 4b. The side wall spacer 5d on the inner side surface covers a peripheral area of the intrinsic base region 4d, and an central area of the intrinsic base region 4d is still exposed.

Heavily arsenic-doped polysilicon is grown on the entire surface of the resultant semiconductor structure, and a heavily arsenic-doped polysilicon layer is held in contact with the central area of the intrinsic base region 4d. A photo-resist etching mask (not shown) is patterned on the heavily arsenic-doped polysilicon layer, and the heavily arsenic-doped polysilicon layer is patterned into an emitter electrode 4e.

The arsenic is thermally diffused from the emitter electrode 4e into the central area of the intrinsic base region 4d by using a lamp annealing, and forms an emitter region 4f.

Finally, a collector contact hole is formed in the silicon oxide layer 5a, and a collector electrode 4g is held in contact with the corrector contact region 4a through the collector contact hole as shown in FIG. 1G.

Thus, the side wall spacer 5d causes the emitter region 4f to be exactly nested into the intrinsic base region 4c, and the emitter region 4f never enters into the graft base region 4c. However, the n-type epitaxial silicon layer 2a is too thick to improve the switching speed. In detail, it is important to reduce the collector resistance for a high speed switching action, and the reduction of the collector resistance is achieved by a thin n-type epitaxial layer 2a. However, if the n-type epitaxial layer 2a is thin, the n-type dopant impurity is diffused from the heavily doped n-type buried layer 1b into the thin epitaxial layer 2a during the heat treatment for the thick field oxide layer 3, and increases the dopant concentration of the n-type epitaxial layer 2a. A lightly doped n-type region called as "flat zone" is necessary for the collector region, and the n-type dopant impurity diffused from the heavily doped n-type buried layer 1b damages the flat zone. This results in deterioration of the bipolar transistor. Thus, the diffusion from the heavily doped n-type buried layer 1b does not allow the manufacturer to make the n-type epitaxial layer 2a thin, and the thick n-type epitaxial layer 2a sets a limit on the switching speed of the prior art bipolar transistor.

A problem of the prior art process is the lithographic step repeated twice for the heavily doped n-type buried layer 1b and the heavily doped p-type buried layer 1c. The prior art process is complex, and increases the production cost of the prior art bipolar transistor.

SUMMARY OF THE INVENTION

It is therefore an important object of the present invention to provide a bipolar transistor which is improved in switching speed.

It is also an important object of the present invention to provide a simple process of fabricating the bipolar transistor.

To accomplish the object, the present invention proposes to grow a lightly doped epitaxial silicon layer in a recess formed after a growth of a field oxide layer.

In accordance with one aspect of the present invention, there is provided a bipolar transistor fabricated on a silicon substrate of a first conductivity type, comprising: a heavily doped impurity region formed in a surface portion of the silicon substrate and having a second conductivity type opposite to the first conductivity type, a recess being formed in a surface portion of the heavily doped impurity region; a lightly doped epitaxial silicon layer of the second conductivity type filling the recess and having a flat zone substantially constant in dopant concentration below a first surface portion thereof; a base region of the first conductivity type formed in the first surface portion of the lightly doped epitaxial silicon layer; a heavily doped collector contact region of the second conductivity type formed in a second surface portion of the lightly doped epitaxial silicon layer contiguous to the flat zone; and an emitter region of the second conductivity type formed in a surface portion of the base region.

In accordance with another aspect of the present invention, there is provided a process of fabricating a bipolar transistor, comprising the steps of: a) preparing a silicon substrate of a first conductivity type; b) introducing a first dopant impurity into a surface portion of the silicon substrate so as to form a heavily doped impurity region of a second conductivity type opposite to the first conductivity type; c) thermally growing a field insulating layer occupying at least an outer peripheral area of the heavily doped impurity region; d) selectively removing a central portion of the heavily doped impurity region for forming a recess therein; e) epitaxially growing a single crystal silicon in the recess so as to form a lightly doped epitaxial silicon layer of the second conductivity type; and f) forming a base region in a surface portion of the lightly doped epitaxial silicon layer and an emitter region in a surface portion of the base region.

BRIEF DESCRIPTION OF THE DRAWINGS

The features and advantages of the bipolar transistor and the process according to the present invention will be more clearly understood from the following description taken in conjunction with the accompanying drawings in which.

DESCRIPTION OF THE PREFERRED EMBODIMENTS

First Embodiment

FIGS. 2A to 2H illustrate a process of fabricating a bipolar transistor embodying the present invention. The bipolar transistor described hereinbelow is assumed to be an n-p-n type. However, a p-n-p type bipolar transistor is fabricated on an n-type silicon substrate by exchanging the conductivity types of dopant impurities.

Figure 1A:
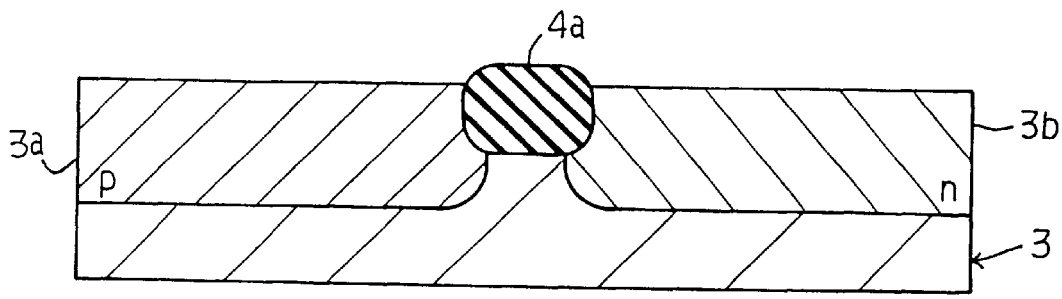
FIGS. 1A to 1G are cross sectional views showing the prior art process of fabricating the self-aligned bipolar transistor.
Figure 1B:
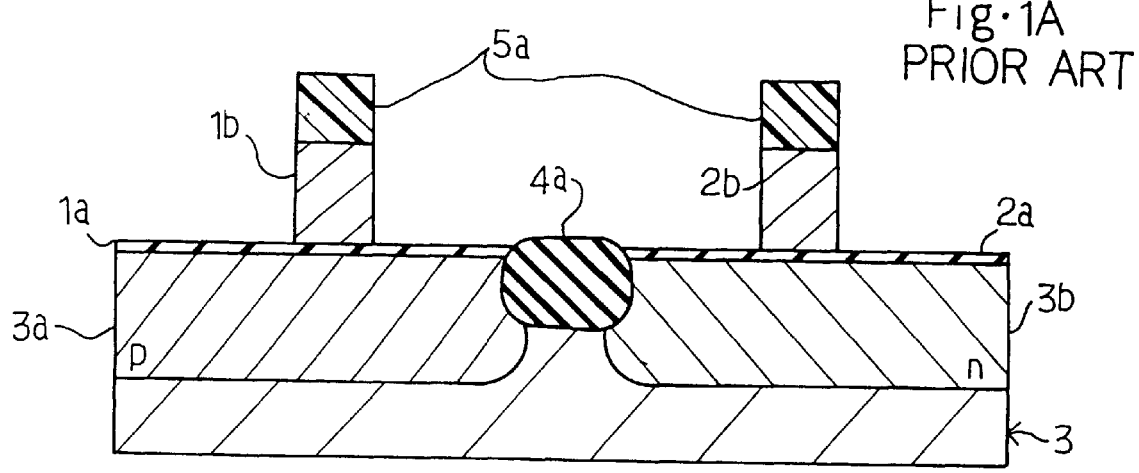
Figure 1C:
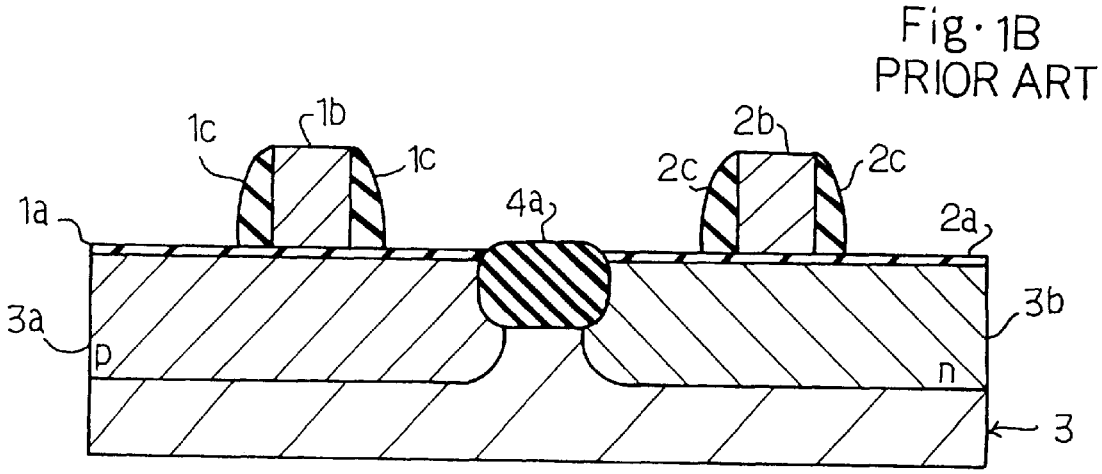
Figure 1D:
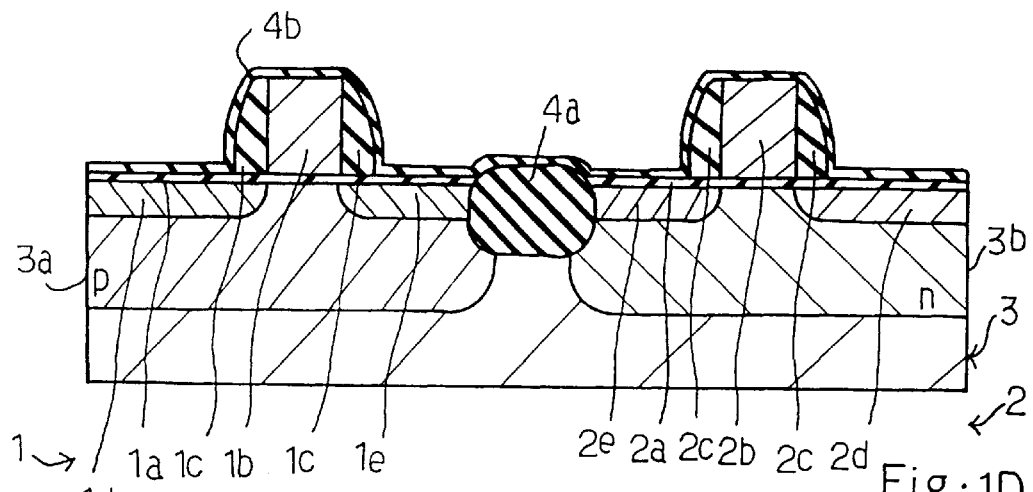
Figure 1E:
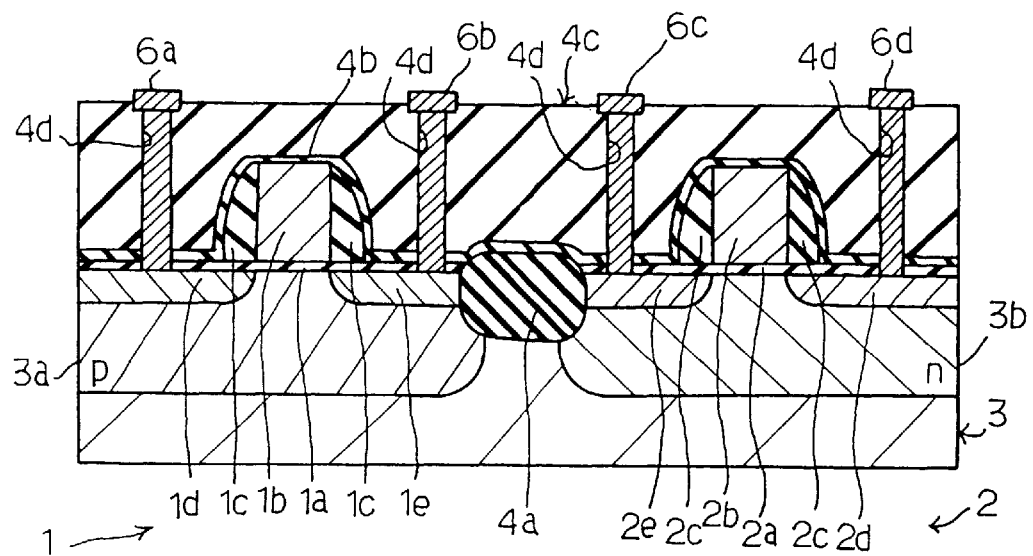
Figure 1F:
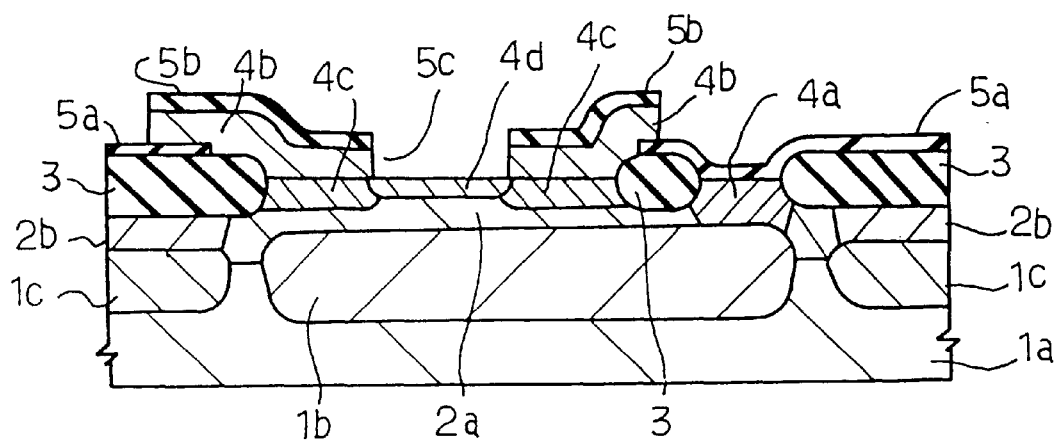
Figure 1G:
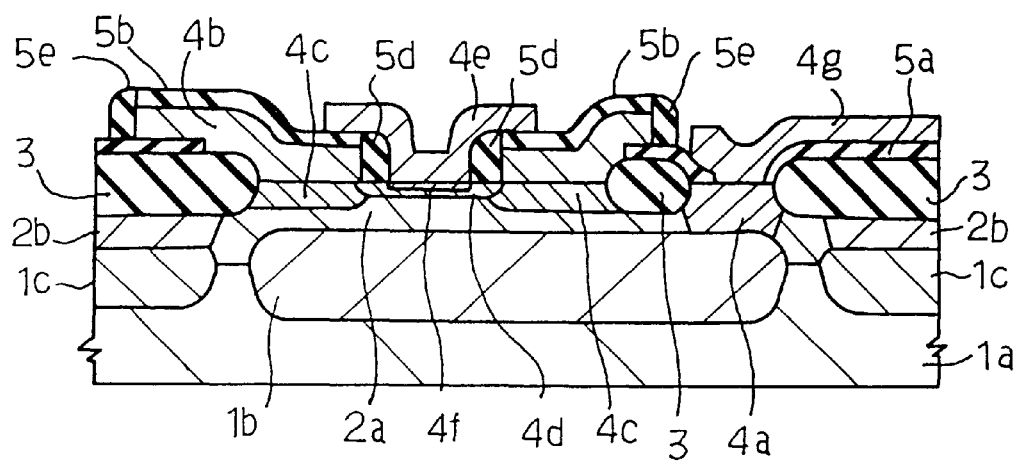
Figure 2A:
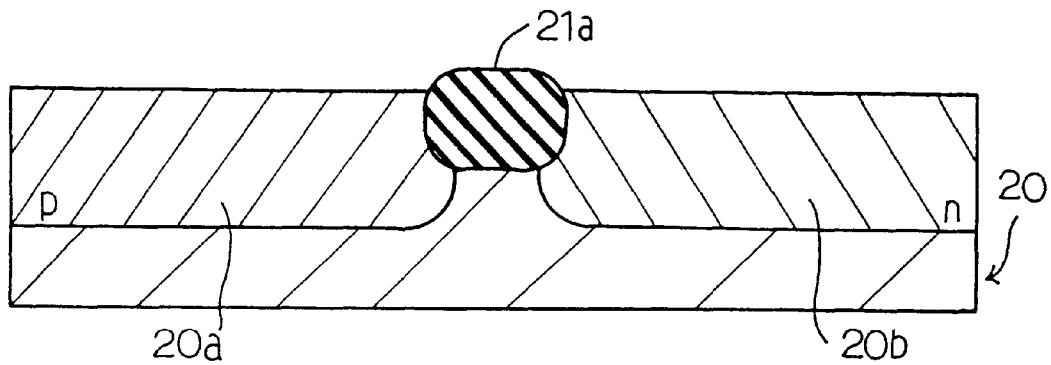
FIGS. 2A to 2H are cross sectional views showing a process of fabricating a bipolar transistor according to the present invention.

The process starts with preparation of a p-type silicon substrate 11. The p-type silicon substrate 11 has an major surface 11a with crystal plane (100). Boron is ion implanted through the major surface 11a into the p-type silicon substrate 11 at dose of $1 \times 10^{13}$ to $3 \times 10^{13}$ ion per $cm^2$ under acceleration energy of 250 KeV to 350 KeV. The ion-implanted boron forms a heavily doped p-type impurity layer 11b of 0.4 micron to 1.0 micron in depth. Although the ion-implantation is carried out, no heat treatment follows the ion-implantation. The resultant semiconductor structure is illustrated in FIG. 2A.

Figure 2B:
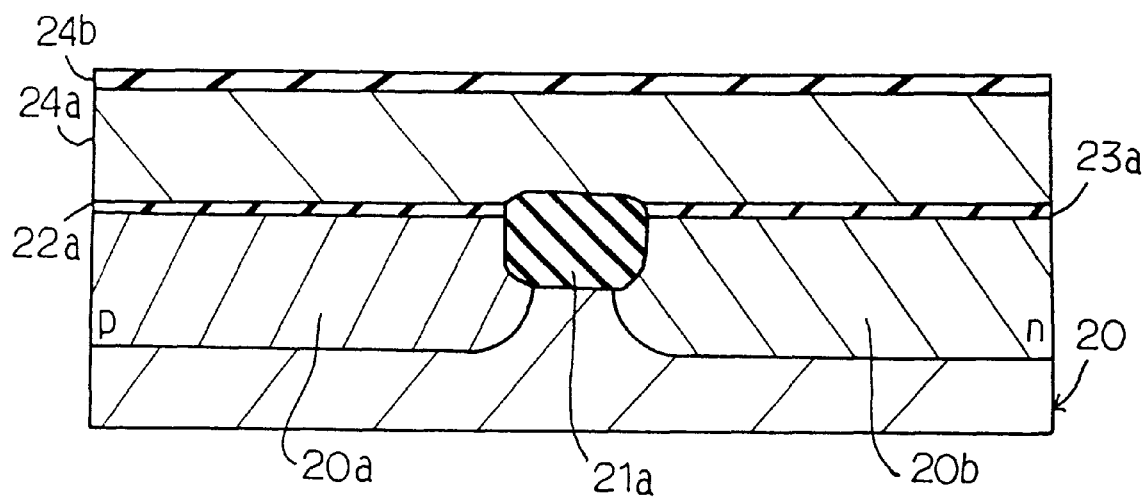
Figure 2C:
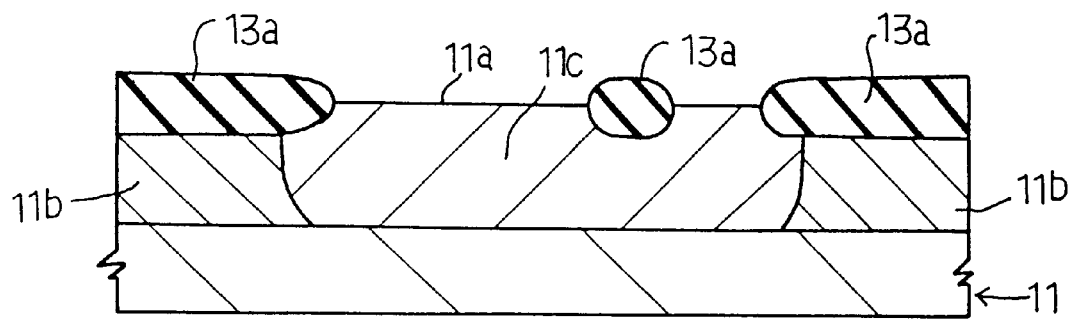

A photo-resist solution is spread over the upper surface of the heavily-doped p-type impurity layer 11b, and is baked so as to form a photo-resist layer on the heavily doped p-type impurity layer. A pattern image is optically transferred from a photo-mask to the photo-resist layer by using a lithography, and forms a latent image in the heavily doped p-type impurity layer 11b. The latent image is developed, and the photo-resist layer is patterned into a photo-resist ion-implantation mask 12. Using the photo-resist ion-implantation mask 12, phosphorous is ion implanted into the heavily doped p-type impurity layer 11b at dose of $4 \times 10^{14}$ ions per cm$^2$ to $6 \times 10^{14}$ ions per cm$^2$ under acceleration energy of 550 KeV to 650 KeV, and forms a heavily doped n-type impurity region 11c as shown in FIG. 2B. The heavily doped n-type impurity region 11c is as deep as the heavily doped p-type impurity region 11b, and is corresponding to the heavily doped n-type buried layer 1b and the heavily doped n-type impurity region 4a.

The photo-resist ion-implantation mask 12 is stripped off. A thick field oxide layer 13a is selectively grown to 300 to 400 nanometers thick on the major surface 11a by using the LOCOS technology. While the thick field oxide layer is being grown, the heat activates the n-type dopant impurity of the heavily doped n-type impurity region 11c and the p-type dopant impurity of the heavily doped p-type impurity layer 11b.

Subsequently, silicon oxide is deposited over the resultant semiconductor structure, and a silicon oxide layer topographically extends over the entire surface of the resultant semiconductor structure. A photo-resist etching mask (not shown) is provided on the silicon oxide layer by using the lithographic techniques, and the silicon oxide layer is patterned into a mask layer 13b.

Figure 2D:
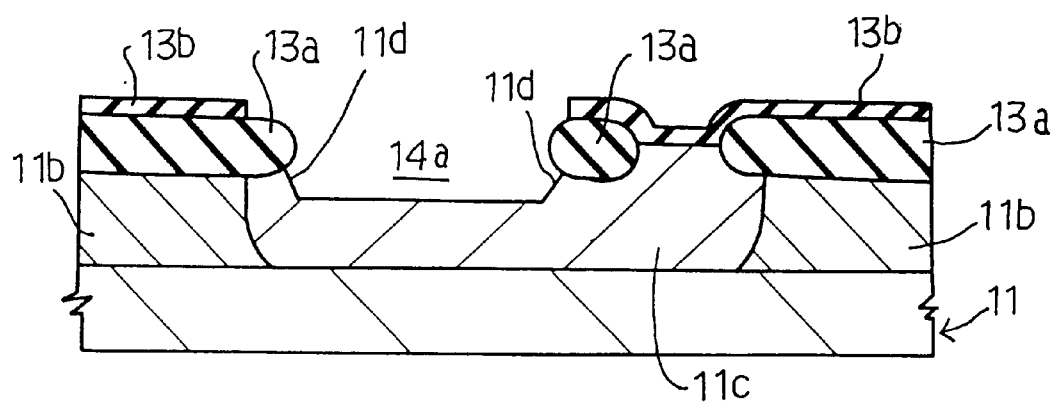

The resultant semiconductor structure is dipped into an etchant containing hydrazine or potassium hydroxide. The mask layer serves as an etching mask, and a recess 14a is formed in the heavily doped n-type impurity region 11c. {100} crystal plane defines the bottom of the recess 14a. The etchant causes (111) crystal plane of single crystal silicon or the equivalent crystal plane, which are hereinbefore referred to as {111} crystal plane, to form the inner surface 11d defining the recess 14a. The recess 14a ranges 0.2 micron to 0.8 micron in depth, and is shallower than the heavily doped n-type impurity region 11c. The outer periphery of the recess 14a is terminated at the lower surface of the thick field oxide layer 13a. The resultant semiconductor structure is illustrated in FIG. 2D.

Figure 2E:
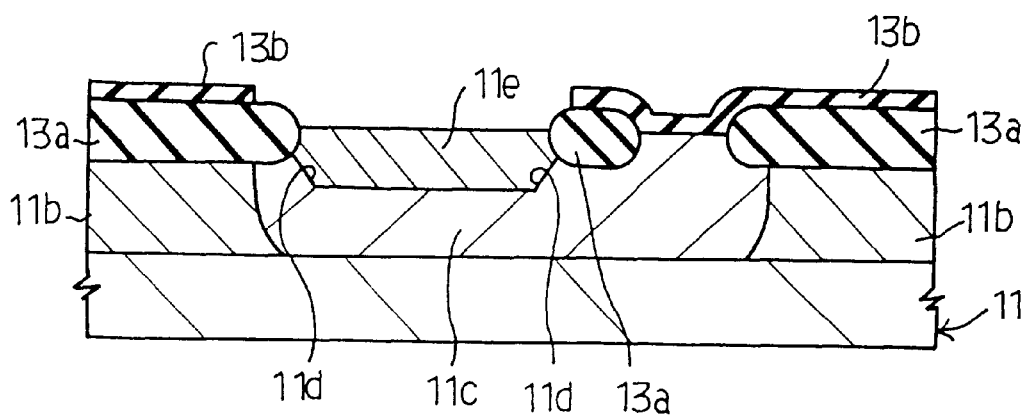

Lightly doped n-type single crystal silicon is grown in the recess 14a by using a selective epitaxial growing technique, and forms a lightly doped n-type single crystal silicon layer 11e as shown in FIG. 2E. In this instance, the selective epitaxial growing technique is a chemical vapor deposition, and the lightly doped n-type single crystal silicon is grown from gaseous mixture containing SiH$_2$Cl$_2$ and HCL at 700 degrees to 800 degrees in centigrade. Water vapor or oxygen in the gaseous mixture is minimized, and is less than $10^{-7}$ torr. For this reason, the deposition temperature is lowered. The lightly doped n-type single crystal silicon is grown on (100) crystal plane forming the bottom surface of the recess 14a, and is hardly grown on {111} crystal plane. For this reason, the lightly doped n-type single crystal silicon is flat and good in crystal. The dopant concentration of the lightly doped n-type single crystal silicon layer 11e is of the order of $1 \times 10^{15}$ atoms per cm$^3$.

Polysilicon is grown on the resultant semiconductor structure to 150 nanometers to 300 nanometers thick by using the chemical vapor deposition, and p-type dopant impurity is introduced into the polysilicon layer at $10^{18}$ atoms per cm$^3$. Insulating material is further deposited to 100 nanometers to 200 nanometers thick over the p-type polysilicon layer, and the p-type polysilicon layer is overlain by an insulating layer. A photo-resist etching mask (not shown) is provided on the insulating layer, and the insulating layer and the p-type polysilicon layer are patterned into a base electrode 15a and an inter-level insulating layer 13c.

Subsequently, a photo-resist etching mask (not shown) is formed on the inter-level insulating layer 13c, and the inter-level insulating layer 13c and the base electrode 15a are selectively etched away so as to form a primary emitter contact hole 14b in the lamination of the inter-level insulating layer 13c and the base electrode 15a.

Heat is applied to the base electrode 15a, and the p-type dopant impurity is diffused from the base electrode 15a into an outer peripheral area of the lightly doped n-type single crystal silicon layer 11e. The p-type dopant impurity forms a graft base region 11f.

Figure 2F:
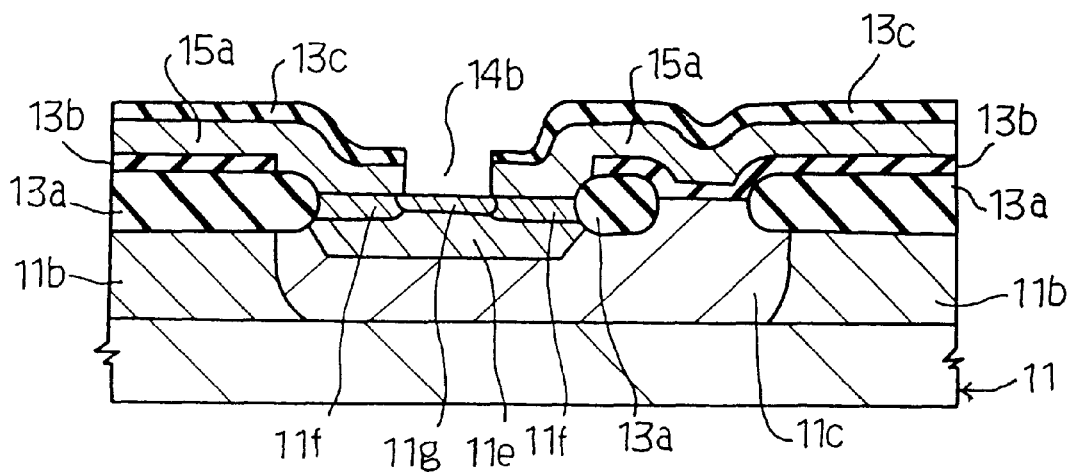

P-type dopant impurity such as boron or boron difluoride is ion implanted into the central area of the lightly doped n-type single crystal silicon layer 11e exposed to the primary emitter contact hole 14b, and forms an intrinsic base region 11g inside of the graft base region 11f. The resultant semiconductor structure is illustrated in FIG. 2F.

Silicon oxide is deposited over the resultant semiconductor structure, and a silicon oxide layer topographically extends over the entire surface of the resultant semiconductor structure. The silicon oxide layer is anisotropically etched without a photo-resist etching mask, and a side wall spacer 15c is formed on the inner side surfaces of the base electrode/inter-level insulating layer 15a/13c. The side wall spacer 15c defines a secondary emitter contact hole 14c, and only a central area of the intrinsic base region 11g is exposed to the secondary emitter contact hole 14c.

Heavily arsenic-doped polysilicon is grown to 100 nanometers to 200 nanometers thick over the resultant semiconductor structure, and the arsenic concentration is of the order of $10^{19}$ to $10^{21}$ atoms per cm$^3$. The heavily arsenic-doped polysilicon fills the secondary emitter contact hole, and swells into a heavily doped arsenic-doped polysilicon layer. The heavily doped arsenic-doped polysilicon layer is held in contact with the central area of the intrinsic base region 11g exposed to the secondary emitter contact hole 14c.

Figure 2G:
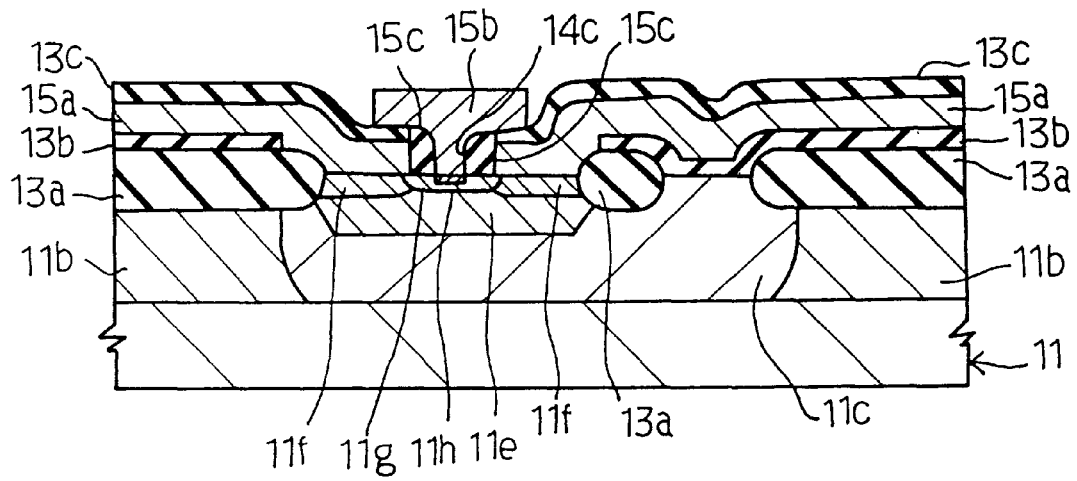

A photo-resist etching mask (not shown) is formed on the heavily arsenic-doped polysilicon layer, and the heavily arsenic-doped polysilicon layer is patterned into an emitter electrode 15b. The arsenic is thermally diffused into the central area of the intrinsic base region 11g by using a lamp annealing, and forms an emitter region 11h as shown in FIG. 2G.

The base electrode 15a is further patterned by using the lithographic techniques, and becomes small. A photo-resist etching mask (not shown) is provided on the resultant semiconductor structure, and has an opening over the heavily doped n-type impurity region 11c on the right side of the lightly doped n-type single crystal silicon layer 11e. The silicon oxide layer 13b is selectively etched away, and a collector contact hole 14d is formed in the silicon oxide layer 13b. The heavily doped n-type impurity region 11c is partially exposed to the collector contact hole 14d.

Figure 2H:
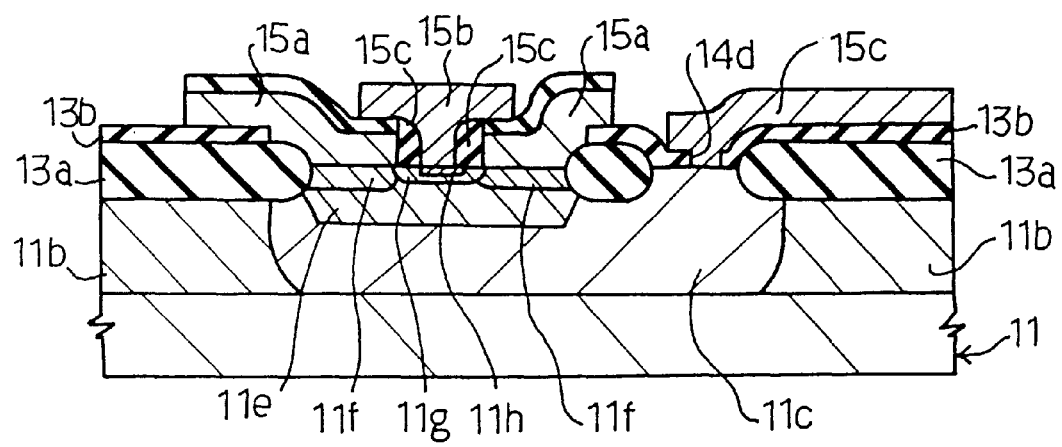

Doped polysilicon is deposited over the entire surface of the resultant semiconductor structure. The doped polysilicon fills the collector contact hole, and swells into a doped polysilicon layer. The doped polysilicon layer is patterned into a collector electrode 15c held in contact with the heavily doped n-type impurity region 11c as shown in FIG. 2H.

Thus, the graft base region 11f and the intrinsic base region 11g are formed in the lightly doped n-type single crystal silicon layer 11e which was grown in the heavily doped n-type impurity region 11c. The lightly doped n-type single crystal silicon layer 11e and the heavily doped n-type impurity region 11c serve as a collector region of the bipolar transistor.

The lightly doped n-type single crystal silicon layer 11e is completed during the growth of the thick field oxide layer 13a, and is free from undesirable out-diffusion inherent in the prior art bipolar transistor. For this reason, the impurity profile in the collector region is stable, and the collector region has a clear flat zone.

Figure 3:
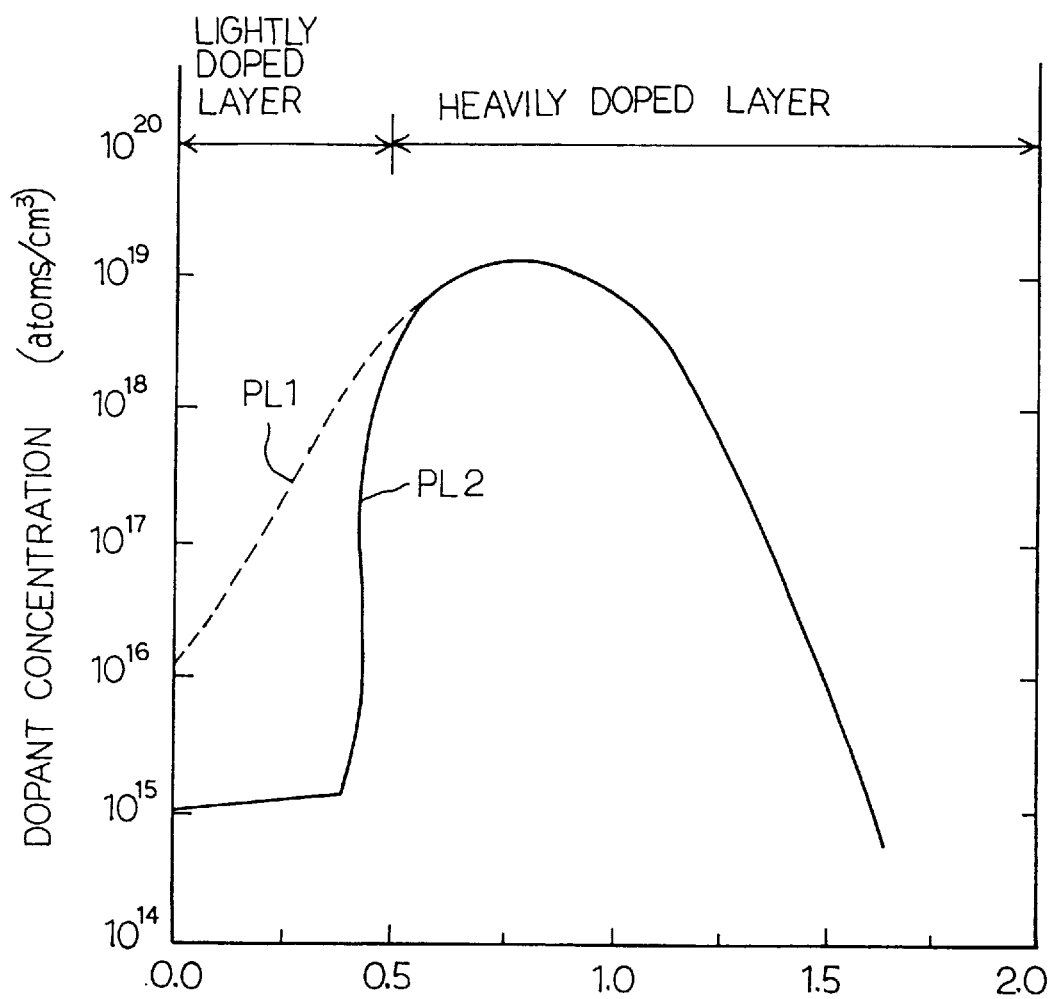
FIG. 3 is a graph showing an impurity profile of a collector region of the bipolar transistor.

The present inventor confirmed the flat zone formed in the collector region. The present inventor measured the dopant concentration in the collector region of the bipolar transistor according to the present invention and in the collector region of the prior art bipolar transistor, and plotted the impurity profiles in FIG. 3. The lightly doped n-type single crystal silicon layer 11e and the n-type epitaxial silicon layer 2a were corresponding to "lightly doped layer", and were 0.5 micron thick. The heavily doped n-type impurity region 11c and the heavily doped n-type buried layer 1b were represented by "heavily doped layer".

The impurity profile of the prior art bipolar transistor was represented by plots PL1, and a flat zone was not observed. On the other hand, plots PL2 represented the impurity profile of the present invention, and a flat zone was clearly formed in the lightly doped layer around $10^{15}$ atoms per $cm^3$. Thus, even if the lightly doped n-type single crystal silicon layer 11e was only 0.5 micron thick, the flat zone was clearly observed, and the extremely thin lightly doped n-type single crystal silicon layer 11e drastically decreased the collector resistance without sacrifice of the transistor characteristics.

Moreover, the p-type impurity region 11b is formed through the ion-implantation of the p-type dopant impurity without the lithography, and the fabrication process becomes simple.

Second Embodiment

Figure 4:
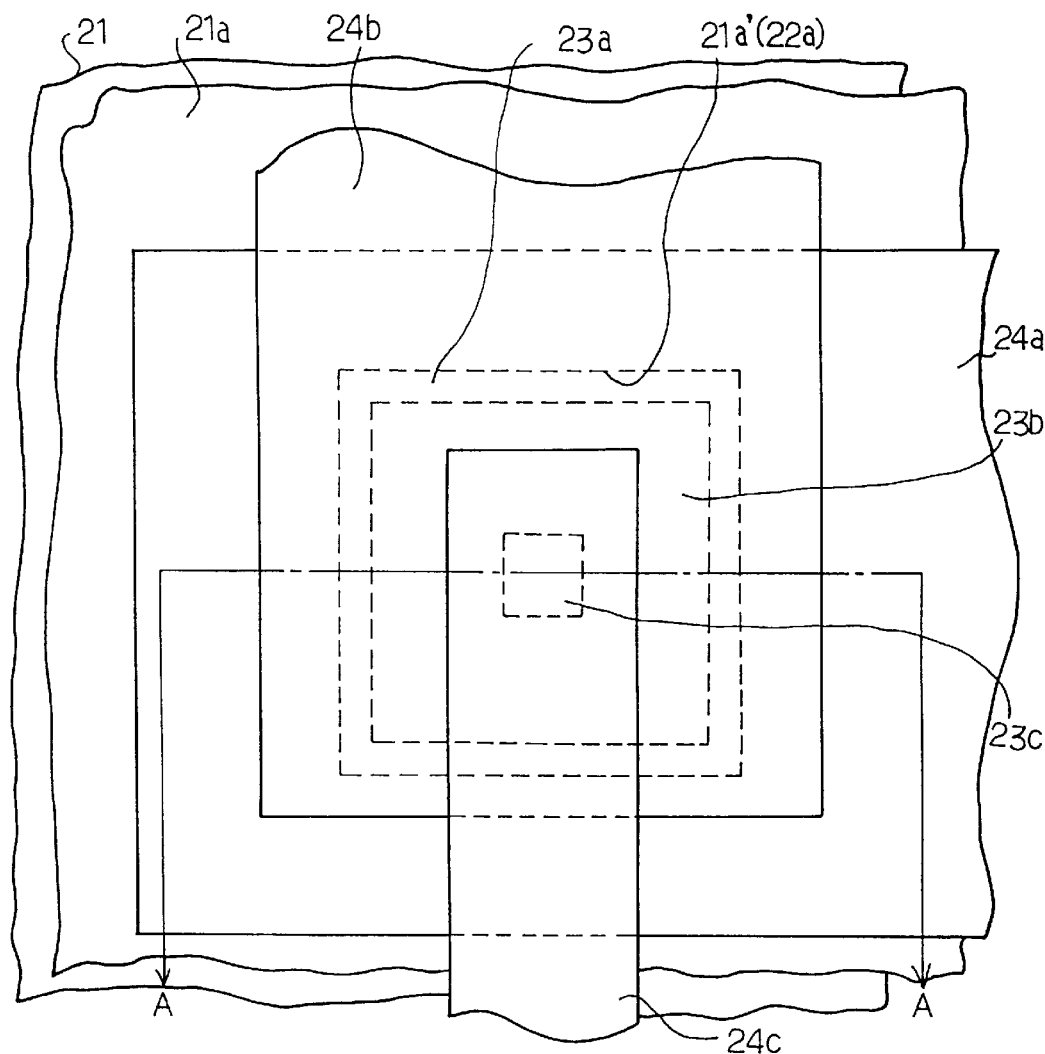
FIG. 4 is a plan view showing the layout of another bipolar transistor according to the present invention.

FIG. 4 illustrates the layout of another bipolar transistor embodying the present invention, and FIGS. 5A to 5H show a process of fabricating the bipolar transistor. A thick field oxide layer 21a is selectively grown on a p-type silicon substrate 21, and has an inner edge 21a' defining a recess 22a filled with a lightly doped n-type single crystal silicon layer 21b (not shown in FIG. 4).

A heavily doped collector contact region 23a is formed in the peripheral area of the lightly doped n-type single crystal silicon layer 21b along the inner edge 21a', and a collector electrode 24a is held in contact with the collector contact region 22a.

A graft base region 23b is formed inside of the heavily doped collector contact region 23a, and a base electrode 24b is held in contact with the graft base region 23b. The base electrode 24b is electrically isolated from the collector electrode 24a by means of an inter-level insulating layer 25a (not shown in FIG. 4).

An emitter region 23c is formed inside of the graft base region 23b, and an emitter electrode 24c is held in contact with the emitter region 23c. An inter-level insulating layer 25b (not shown in FIG. 4) electrically isolates the emitter electrode 24c from the base electrode 24b. The collector electrode 24a, the base electrode 24b and the emitter electrode 24c are self-aligned with the thick field oxide layer 21a, the collector electrode 24a and the base electrode 24b, respectively.

The bipolar transistor shown in FIG. 4 is fabricated as follows. The p-type silicon substrate 21 is firstly prepared, and (100) crystal plane forms the major surface 21b of the p-type silicon substrate 21.

Boron is ion implanted through the major surface 21b into the p-type silicon substrate 21, and forms a heavily doped p-type impurity layer 21c. The heavily doped p-type impurity layer 21c is 0.4 micron to 1.0 micron in thickness. The ion-implantation of the boron is carried out under the same conditions as the first embodiment.

Subsequently, phosphorous is ion implanted into the heavily doped p-type impurity layer 21c, and forms a heavily doped n-type impurity region 21d as deep as the heavily doped p-type impurity layer 21c. The ion-implantation of the phosphorous is carried out under the same conditions as-the first embodiment.

Figure 5A:
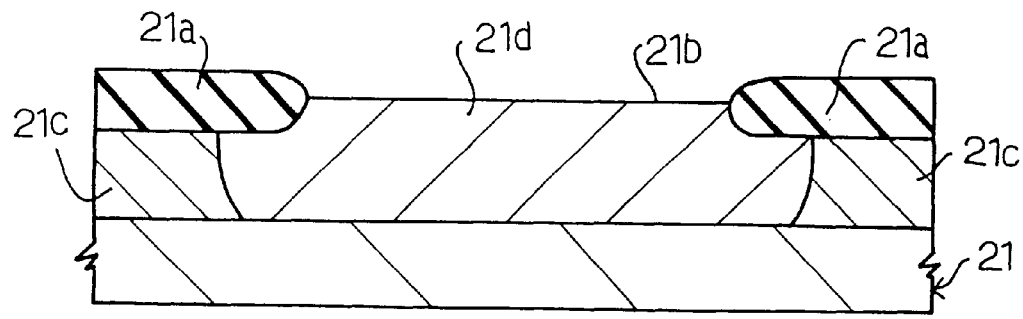
FIGS. 5A to 5H are cross sectional views taken along line A—A of FIG. 4 and showing a process of fabricating the bipolar transistor.

The thick field oxide layer 21a is selectively grown to 300 nanometers to 400 nanometers thick by using the LOCOS technology, and the ion-implanted boron and the ion-implanted phosphorous are activated with heat during the growth of the thick field oxide layer 21a. The resultant semiconductor structure is shown in FIG. 5A.

Figure 5B:
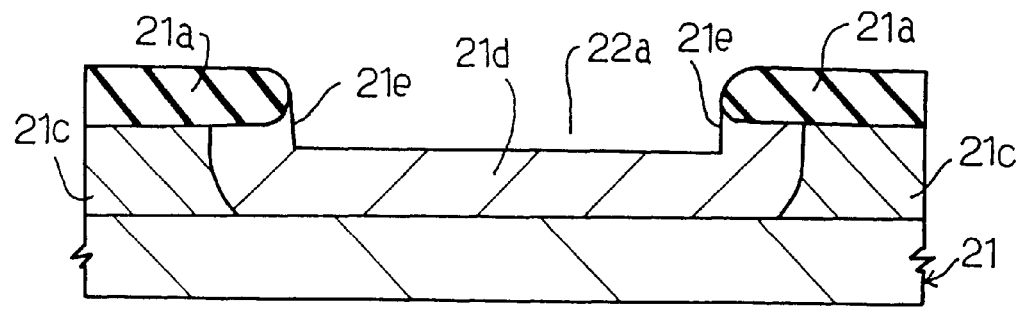

Using the thick field oxide layer 21a as an etching mask, the heavily doped n-type impurity region 21d is selectively etched away by using an anisotropic dry etching technique, and forms a recess 22a in the heavily doped n-type impurity region 21d. The anisotropic dry etching does not control the crystal plane of the inner surface 21e of the heavily doped n-type impurity region 21d. The recess 22a is shallower than the heavily doped n-type impurity region 21d by 0.2 micron to 0.8 micron, and the resultant semiconductor structure is shown in FIG. 5B.

Figure 5C:
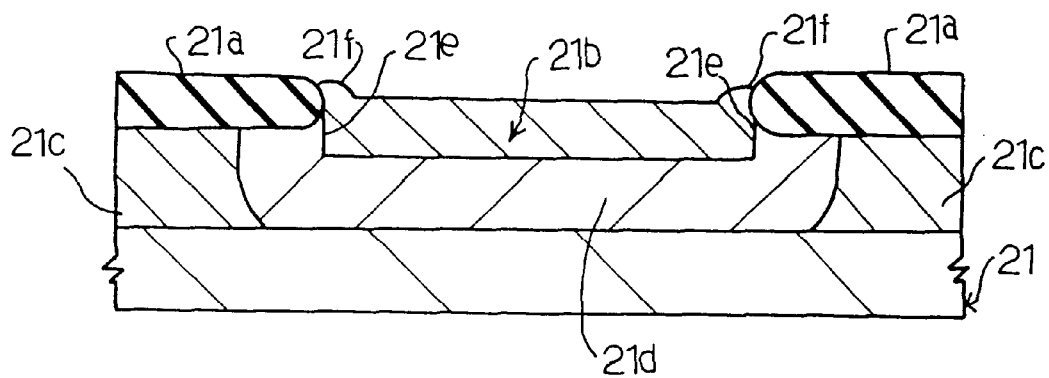

The lightly doped n-type single crystal silicon is epitaxially grown in the recess 22a, and the dopant concentration of the lightly doped n-type single crystal silicon is of the order of $1 \times 10^{16}$ atoms per $cm^3$. The selective epitaxial growth is carried out by using the chemical vapor deposition as similar to the first embodiment. However, the lightly doped single crystal silicon is grown on not only the bottom surface but also the inner surface 21e, and the lightly doped single crystal silicon layer 21b has a convex portion 21f along the inner edge of the thick field oxide layer 21a as shown in FIG. 5C. However, the height of the convex portion 21f is not greater than 0.1 micron.

Figure 5D:
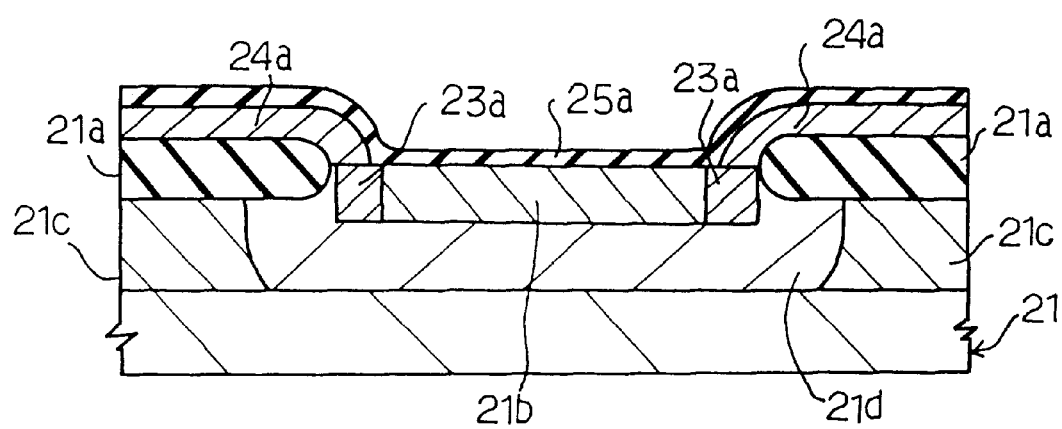

Phosphorous-doped polysilicon is deposited to 100 nanometers to 200 nanometers thick over the resultant semiconductor structure by using a chemical vapor deposition, and the phosphorous concentration is of the order of $10^{19}$ atoms per $cm^3$. The phosphorous-doped polysilicon is patterned into the collector electrode 24a, and the inter-level insulating layer 25a of 200 nanometers thick is deposited over the resultant structure. Subsequently, the collector electrode 24a is heated, and the phosphorous is thermally diffused from the collector electrode 24a into the peripheral area of the lightly doped n-type single crystal silicon layer 21b. The phosphorous forms the collector contact region 23a as shown in FIG. 5D.

Figure 5E:
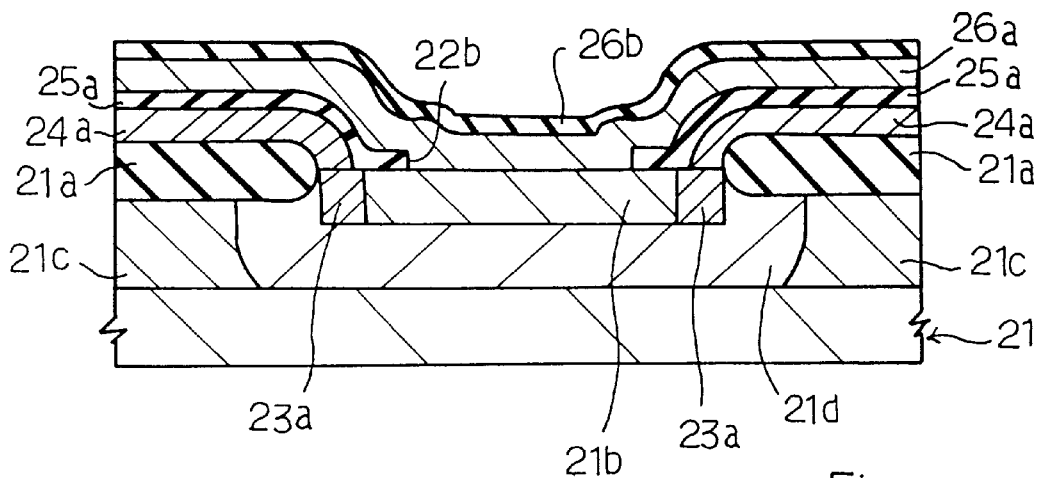

Subsequently, a part of the inter-level insulating layer 25a is etched away, and forms a base contact hole 22b to which the lightly doped n-type single crystal silicon layer 21b is exposed. P-type doped polysilicon is deposited to 150 nanometers to 300 nanometers thick over the resultant semiconductor structure, and the dopant concentration of the p-type doped polysilicon contains the p-type dopant impurity of the order of $10^{18}$ atoms per $cm^3$. The p-type doped polysilicon layer 26a is held on contact with the lightly doped n-type single crystal silicon layer 21b through the base contact hole 22b. The resultant semiconductor structure is covered with an insulating layer 26b of 100 nanometers to 200 nanometers thick as shown in FIG. 5E.

The insulating layer 26b and the p-type doped polysilicon layer 26a are patterned into the inter-level insulating layer 25b and the base electrode 24b, and a primary emitter contact hole 22c is formed in the lamination of the base electrode 24b and the inter-level insulating layer 25b.

Heat is applied to the base electrode 24b, and the p-type dopant impurity is diffused from the base electrode 24b into the lightly doped n-type single crystal silicon layer 21b, and forms the graft base region 23b.

Figure 5F:
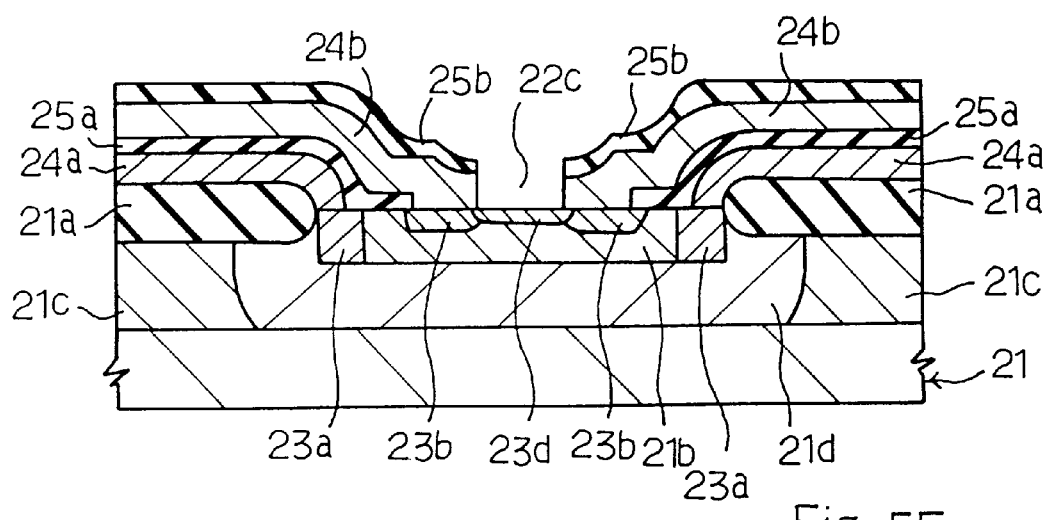

Boron or boron difluoride is ion implanted through the primary emitter contact hole 22c into the lightly doped n-type single crystal silicon layer 21b, and is activated through a heat treatment. As a result, an intrinsic base region 23d is formed inside of the graft base region 23b as shown in FIG. 5F.

Figure 5G:
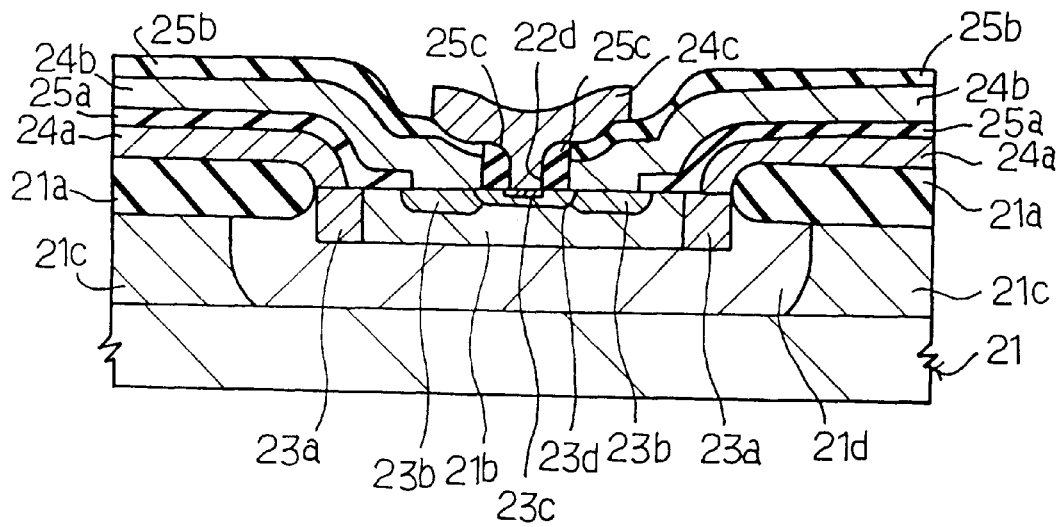
Figure 5H:
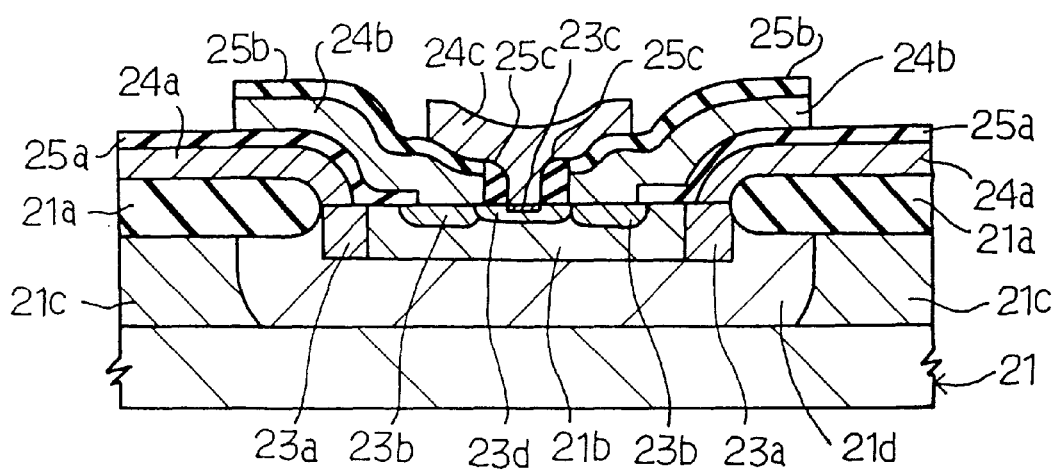

Silicon oxide is deposited over the resultant semiconductor structure, and a side wall spacer 25c is formed from the silicon oxide layer on the inner surface of the lamination of the base electrode 24b and the inter-level insulating layer 25b by using an etch-back technique. The side wall spacer 25c defines a secondary emitter contact hole 22d. Heavily arsenic-doped polysilicon is deposited to 100 nanometer to 200 nanometers thick, and arsenic concentration is of the order of $10^{19}$ to $10^{21}$ atoms per cm$^3$. The heavily arsenic-doped polysilicon layer is patterned into the emitter electrode 24c, and the arsenic is thermally diffused from the emitter electrode 24c into the central area of the intrinsic base region 23d through a lamp annealing. The arsenic forms the emitter region 23c as shown in FIG. 5G.

Finally, the base electrode 24b and the inter-level insulating layer 25b are partially etched away, and becomes small.

Thus, the collector contact region 23a, the graft base region 23b and the intrinsic base region 23d are formed in the lightly doped single crystal silicon layer 21b, and the lightly doped n-type single crystal silicon layer 21b is formed after the growth of the thick field oxide layer 21a, and the n-type dopant impurity is less diffused from the heavily doped n-type impurity region 21d into the lightly doped n-type single crystal silicon layer 21b. As a result, a flat zone takes place in the lightly doped n-type single crystal silicon layer 21b, and collector resistance is decreased without sacrifice of the transistor characteristics.

The collector electrode 24a, the base electrode 24b and the emitter electrode 24c are respectively self-aligned with the thick- field oxide layer 2a, the collector electrode 24a and the base electrode 24b. For this reason, the bipolar transistor implementing the second embodiment is suitable for an ultra large scale integration.

If the edge of the recess is directed to [110], a facet takes place in the periphery of the lightly doped n-type single crystal silicon layer, and cancels the convex portion. Therefore, a flat surface is created in the second embodiment.

Although particular embodiments of the present invention have been shown and described, it will be obvious to those skilled in the art that various changes and modifications may be made without departing from the spirit and scope of the present invention.

For example, if the recess 14a is formed in the heavily doped n-type impurity region 11c through a dry etching, (110) crystal plane or the equivalent crystal plane forms the inner surface 11d, and the single crystal silicon layer 11e is similarly grown.

The heavily doped n-type impurity region 21c may be formed after the growth of the thick field oxide layer 21a.

The heavily doped n-type impurity regions 11c/21d may be thicker than the heavily doped p-type impurity layer 11b/21c.

A p-n-p type bipolar transistor may be formed through one of the processes described hereinbefore.

What is claimed is:

1. A process of fabricating a bipolar transistor, comprising the steps of:
    a) preparing a silicon substrate of a first conductivity type;
    b) introducing a first dopant impurity into a surface portion of said silicon substrate so as to form a heavily doped impurity region of a second conductivity type opposite to said first conductivity type;
    c) thermally growing a field insulating layer occupying at least an outer peripheral area of said heavily doped impurity region;
    d) selectively removing a central portion of said heavily doped impurity region for forming a recess therein;
    e) epitaxially growing a single crystal silicon in said recess so as to form a lightly doped epitaxial silicon layer of said second conductivity type; and
    f) forming a base region in a surface portion of said lightly doped epitaxial silicon layer and an emitter region in a surface portion of said base region.

2. The process as set forth in claim 1, in which said surface portion of said silicon substrate is formed by (100) crystal plane or a crystal plane equivalent to said (100) crystal plane, and said heavily doped impurity region has a first surface defining a bottom of said recess and formed by said (100) crystal plane or said crystal plane equivalent to said (100) crystal plane.

3. The process as set forth in claim 2, in which said heavily doped impurity region further has a second surface defining a side of said recess and formed by (111) crystal plane, (110) crystal plane or a crystal plane equivalent to said (111) crystal plane or said (110) crystal plane.

4. The process as set forth in claim 3, further comprising the step of introducing a second dopant impurity into said silicon substrate so as to form another heavily doped impurity region of said first conductivity type between said step a) and said step b), and said heavily doped impurity region of said second conductivity type is nested into said another heavily doped impurity region.

* * * * *